(12) United States Patent
O'Dell et al.

(10) Patent No.: US 7,351,788 B2
(45) Date of Patent: Apr. 1, 2008

(54) POLYMER CONTAINING SUBSTITUTED TRIPHENYLAMINE UNITS

(75) Inventors: Richard O'Dell, Taufkirchen (DE); Carl Towns, Stansted (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 10/481,439

(22) PCT Filed: Jun. 20, 2002

(86) PCT No.: PCT/GB02/02803

§ 371 (c)(1), (2), (4) Date: May 17, 2004

(87) PCT Pub. No.: WO03/000773

PCT Pub. Date: Jan. 3, 2003

(65) Prior Publication Data

US 2004/0254324 A1    Dec. 16, 2004

Related U.S. Application Data

(60) Provisional application No. 60/310,580, filed on Aug. 7, 2001.

(30) Foreign Application Priority Data

Jun. 22, 2001 (GB) ................... 0115348.5

(51) Int. Cl.
*C08G 61/00* (2006.01)
*C08G 61/10* (2006.01)

(52) U.S. Cl. ............... 528/394; 528/7; 528/8; 528/397; 528/422; 257/E51.028; 257/E51.036

(58) Field of Classification Search ........... 528/394, 528/422, 8, 7, 397; 257/E51.028, E51.036
See application file for complete search history.

(56) References Cited

U.S. PATENT DOCUMENTS 4,539,507 A    9/1985    VanSlyke et al. ........... 313/504

(Continued)

FOREIGN PATENT DOCUMENTS

DE    36 10 649 A1    10/1987

(Continued)

OTHER PUBLICATIONS

"The Palladium-Catalyzed Cross-Coupling Reaction of Phenylboronic Acid with Haloarenes in the Presence of Bases", Miyaura et al., Synthetic Communications, 11(7), 1981, pp. 513-519.

(Continued)

*Primary Examiner*—Duc Truong
(74) *Attorney, Agent, or Firm*—Marshall, Gerstein & Borun LLP

(57) ABSTRACT

A method for making a polymer containing a first repeat unit having formula: —Ar—N(R)—Ar(N(R')—Ar)$_x$— which may be substituted or unsubstituted where x or 0 or 1; each Ar is the same or different and independently is a substituted or unsubstituted aryl or heteroaryl group and R and R' each is hydrogen or a substituent group and a second repeat unit that is the same or different from the first repeat unit and comprises a substituted or unsubstituted, aryl or heteroaryl group.

35 Claims, 1 Drawing Sheet

U.S. PATENT DOCUMENTS

Figure 1:
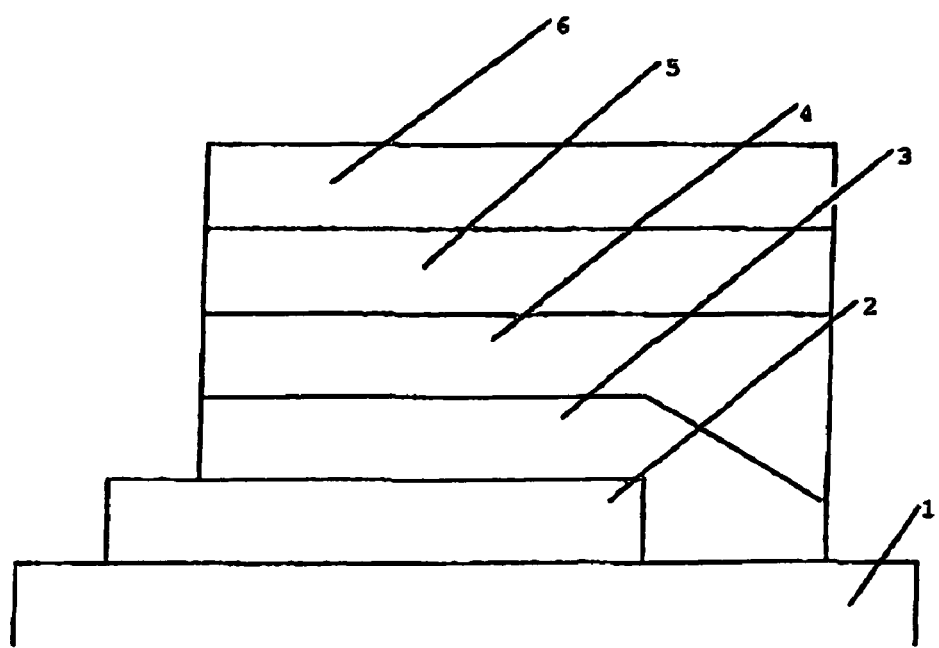

| | | | | |
|---|---|---|---|---|
| 5,728,801 A | 3/1998 | Wu et al. | .................... | 528/422 |
| 5,777,070 A | 7/1998 | Inbasekaran et al. | ....... | 528/394 |
| 5,879,821 A | 3/1999 | Hsich | ......................... | 428/690 |

FOREIGN PATENT DOCUMENTS

| EP | 827 366 A2 | 3/1998 |
|---|---|---|
| EP | 827 366 A3 | 3/1998 |
| GB | 2 265 459 A | 9/1993 |
| JP | 2000-003528 A | 1/2000 |
| WO | WO 90/13148 | 11/1990 |
| WO | WO 92/03490 | 3/1992 |
| WO | WO 99/20675 | 4/1999 |
| WO | WO 99/54385 | 10/1999 |
| WO | WO 00/46321 | 8/2000 |
| WO | WO 00/53656 | 9/2000 |
| WO | WO 00/55927 | 9/2000 |
| WO | WO 01/66618 A1 | 9/2001 |

OTHER PUBLICATIONS

Thermally Stable Blue-Light-Emitting Copolymers of Poly(alkylfluorene), Kreyenschmidt et al., Macromolecules 31, 1998, pp. 1099-1103.

"Boronic Ester-Substituted Triphenylamines as New Lewis Base-Sensitive Redox Receptors", Nicolas et al., Journal of Electroanalytical Chemistry 482, 2000, pp. 211-216.

Chemical Abstracts 133:296790, 134:86602, 132: 348015, 132:58112, 131: 293366, JP 11279165 A2, 129:16584, and 128:89382.

International Search Report in PCT/GB02/02803 dated Sep. 17, 2002.

International Preliminary Examination Report in PCT/GB02/02803 dated May 13, 2003.

Search Report in GB 0115348.5 dated Jan. 8, 2002.

POLYMER CONTAINING SUBSTITUTED TRIPHENYLAMINE UNITS

This is the U.S. national phase of International Application No. PCT/GB02/02803 filed Jun. 20, 2002, the entire disclosure of which is incorporated herein by reference, and the priority benefit under 35 U.S.C. §119(e) of U.S. provisional application Ser. No. 60/310,580 filed Aug. 7, 2001, is hereby claimed.

The present invention relates to polymers and to a method for making the same. The present invention particularly relates to homopolymers, copolymers and higher order polymers obtained by the method, particularly polymers that can be used in optical devices such as electroluminescent devices.

Electroluminescent devices that employ an organic material for light emission are described in PCT/WO90/13148 and U.S. Pat. No. 4,539,507. The basic structure of these devices is a light-emissive organic layer, for instance a film of poly(p-phenylene vinylene) sandwiched between two electrodes. One of the electrodes (the cathode) injects negative charge carriers (electrons) and the other electrode (the anode) injects positive charge carriers (holes) into the light-emissive organic layer. The electrons and holes combine in the organic layer to generate photons. In PCT/WO90/13148 the organic light-emissive layer is made from an organic light-emissive material that is a polymer.

It is known, to use a semiconductive conjugated copolymer as the light-emissive layer in an electroluminescent device. The semiconductive conjugated copolymer comprises at least two chemically different monomeric residues which, when existing in their individual homopolymer forms, typically have different semiconductor bandgaps. The proportion of the chemically different monomeric residues in the copolymer can be selected to control the semiconductive bandgap of the copolymer so as to control the optical properties of the copolymer as disclosed in PCT/GB91/01420.

For organic semiconductors, important characteristics are the binding energies measured with respect to the vacuum level of the electronic energy levels, particularly "the highest occupied molecular orbital" (HOMO) and "lowest unoccupied molecular orbital" (LUMO) levels. The oxidation potential and reduction potential of different polymers is governed by the relative HOMO and LUMO levels of the polymer. Thus, the HOMO and LUMO levels can be estimated from measurement of photoemission and particularly measurements of the electrochemical potentials for oxidation and reduction. It is well understood in the field that such energies are affected by a number of factors. Accordingly, the use of such values is indicative rather than quantitative.

One route to conjugated polymers is known from DE 3610649 which discloses the preparation of triphenylamine homopolymers by Ullman coupling of dibromotriphenylamine monomers with copper. An alternative to the Ullman method is the use pf certain nickel complexes as described in 'Macromolecules', 31, 1099-1103 (1998). The polymerisation reaction involves nickel-mediated coupling of dibromide monomers. This method is known as 'Yamamoto Polymerisation'. The use of the nickel catalyst in Yamamoto Polymerisation presents an economic problem in terms of large scale manufacturing since this catalyst is expensive.

A further route to conjugated polymers is based on the Pd-catalysed cross-coupling reaction (commonly known as the "Suzuki reaction") between an aromatic boronic acid derivative and an aromatic halide. This was reported by Suzuki in Synthetic Communications, Vol. 11 No. 7 page 513 (1981). The reaction also requires a base; aqueous alkaline carbonate or bicarbonate being the most preferred. Developments to the "Suzuki reaction" have been the subject of U.S. Pat. No. 5,777,070 and WO 00/53656, the contents of both of which are incorporated herein by reference.

Polymers preparable by the "Suzuki reaction" are described in WO 99/54385; WO 00/46321 and PCT/GB00/00911. Each of these documents discloses a polymer having a triarylamine repeat unit.

Japanese Patent No. 2000352824 discloses the compound:

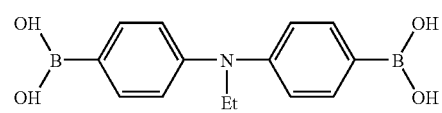

bearing an addition polymerisable ethylenic unsaturated bond. The compound is photopolymerisable and is disclosed to be useful for use as a component of a lithographic printing plate. There is no mention of an optical device, nor is there any mention of the "Suzuki reaction".

J. Electroanal. Chem. 2000, 482(2), (211-216) discloses the following compound:

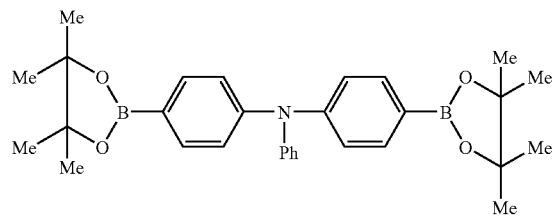

as part of an investigation into boronic ester-substituted triphenylamines as new Lewis base-sensitive redox receptors.

The incorporation of this compound into a polymer is not disclosed.

The present inventors have identified that there exists a deficiency in methods for making regular alternating copolymers by the "Suzuki reaction" in the prior art. The preparation of regular alternating copolymers or higher order polymers is highly advantageous for certain polymers because a regular alternating copolymer or higher order polymer has more defined properties as compared with the corresponding random copolymer. For example, the emission spectrum of a random copolymer may be spread over a broader range (i.e. it will be less defined) as compared with the corresponding regular alternating copolymer. Without wishing to be bound by theory it is thought that perhaps this is due in part to conjugation between the two monomeric residues in the random copolymer.

The deficiency identified by the present inventors relates to the very nature of the "Suzuki reaction". It can be seen that in order to obtain a regular alternating AB copolymer from an A-containing monomer and a B-containing monomer it would be necessary to provide, for example, a diester A-containing monomer and a dihalide B-containing monomer or vice versa. A deficiency will exist where both A-containing monomers and B-containing monomers only are available as, for example, dihalides because this would mean that a regular alternating AB copolymer would not be preparable by the 'Suzuki reaction' and perhaps would not be preparable at all.

Similarly, the present inventors have identified that there exists a deficiency in methods for making homopolymers by the 'Suzuki reaction' in the prior art. The preparation of homopolymers by the 'Suzuki reaction' is advantageous in at least partially overcoming the problems associated with previously known methods as discussed above. Again, the deficiency identified by the present inventors relates to the very nature of the "Suzuki reaction". It can be seen that in order to obtain a homopolymer $(A)_n$ by the 'Suzuki reaction' it would be necessary to provide both diester and dihalide A-containing monomers. A deficiency would exist where A-containing monomers only are available as, for example, dihalides because this would mean that a homopolymer $(A)_n$ would not be preparable by the 'Suzuki' reaction.

Having identified these deficiencies in the prior art, the present inventors aim to at least partially overcome these deficiencies by providing hitherto unknown regular alternating copolymers obtainable by a hitherto unknown route in the 'Suzuki reaction'. The present invention further aims to provide homopolymers, other copolymers and higher order polymers obtained by the hitherto unknown route in the 'Suzuki reaction' or a variation thereof.

Accordingly, a first aspect of the present invention provides a method for making a linear polymer containing a first repeat unit having formula (1):

  (1)

which may be substituted or unsubstituted where x is 0 or 1; each Ar is the same or different and independently is a substituted or unsubstituted aryl or heteroaryl group and R and R' each is hydrogen or a substituent group and a second repeat unit that is the same or different from the first repeat unit and is a substituted or unsubstituted, aryl or heteroaryl group; comprising the step of polymerising in a reaction mixture:

(a) a plurality of first monomers each (i) containing the first repeat unit and (ii) having only two reactive boron derivative groups and a plurality of second monomers each (i) containing the second repeat unit and (ii) having at least two (preferably only two) reactive halide functional groups; or (b) a plurality of first monomers each (i) containing the first repeat unit and (ii) having one reactive halide functional group and one reactive boron derivative group and a plurality of second monomers each (i) containing the second repeat unit and (ii) having one reactive halide functional group and one reactive boron derivative group;

wherein the reaction mixture comprises a base and a catalytic amount of a catalyst suitable for catalysing the polymerisation of the monomers.

A second aspect of the present invention provides a linear regular alternating copolymer obtainable by the method according to one embodiment of the first aspect of the present invention.

A third aspect of the present invention provides a monomer suitable for use in the method according to the first aspect of the present invention.

A fourth aspect of the present invention provides the use of a polymer obtained by the method according to the first aspect of the present invention or a copolymer according to the second aspect of the present invention.

A fifth aspect of the present invention provides an optical device or component therefor comprising a polymer obtained by the method according to the first aspect of the present invention or a copolymer according to the second aspect of the present invention.

According to a sixth aspect of the present invention there is provided the use of a monomer according to the third aspect of the present invention.

For the purposes of the present invention, the term "polymers" should be interpreted to include homopolymers, copolymers, terpolymers and higher order polymers.

For the purposes of the present invention, the phrase, "aryl and heteroaryl groups" may be taken to include substituted or unsubstituted mononuclear and polynuclear aryl and heteroaryl groups. Polynuclear aryl and heteroaryl groups may be taken to include fused ring systems as well as ring systems joined by direct covalent bonds or via another atom such as S, O, C or the like.

In the present method, it is preferred that the or each boron derivative group independently is selected from the group consisting of a boronic acid group, a boronic ester group and a borane group. Furthermore, it is preferred that each reactive halide functional group independently is selected from the group consisting of F, Cl, Br and I.

Preferably, the reaction conditions are in accordance with either WO 00/53656 or U.S. Pat. No. 5,777,070. In the method of WO 00/53656, the reaction mixture comprises a catalytic amount of a catalyst suitable for catalysing the polymerisation of the aromatic monomers (e.g. palladium) and an organic base in an amount sufficient to convert the reactive boron derivative functional groups into $BX_3^-$ anionic groups, wherein X is independently selected from the group consisting of F, OR and OH. In U.S. Pat. No. 5,777,070 the reaction mixture contains an organic solvent (in which the polymer forms at least a 1% solution) an aqueous solution of an inorganic base having a pKa in the range of from 9 to 13, the solution having a concentration of at least 0.1N; a catalytic amount of a palladium complex and at least 0.01 mol % of a phase transfer catalyst based on the number of moles of boronic acid, boronic acid ester and borane groups in the reaction mixture.

One preferred ratio first monomer: second monomer in the reaction mixture is 1:1. However, this ratio may be varied in order to control the properties of the resulting polymer.

In a first embodiment of the first aspect of the present invention, it is preferred that the method proceeds via step (a), particularly such that each first monomer has a formula (2):

  (2)

where each E is a reactive boron derivative group.

In one embodiment of the method according to the first aspect of the present invention, each second monomer has a formula (3):

  (3)

where each E' is a reactive halide functional group and the second repeat unit is a substituted or unsubstituted, aryl or heteroaryl group. The resulting polymer may be as shown in general formula (4):

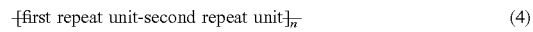  (4)

where n is at least 2.

Where the first repeat unit is different from the second repeat unit, the resulting polymer will be a regular alternating copolymer. Where the first repeat unit is the same as the second repeat unit the resulting polymer will be a homopolymer.

In a second embodiment of the first aspect of the present invention, it is preferred that the method proceeds via step (b) when (i) the first repeat unit is the same as the second repeat unit; and (ii) the first monomer is the same as the second monomer and has a formula (10):

E—first repeat unit—E' (10)

The resulting polymer will be a homopolymer.

In any embodiment of the first aspect of the present invention, preferred R and $R^1$ groups include alkyl, alkoxy, halide (particularly fluoro), haloalkyl (particularly $CF_3$), cyano, aryloxy, aryl and thioalkyl groups. A preferred first repeat unit has formula (5):

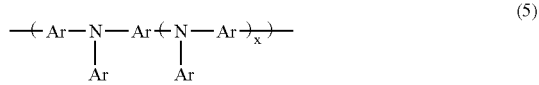

(5)

which may be substituted or unsubstituted, where x is 0 or 1 and each Ar is the same or different from the others and independently is a substituted or unsubstituted aryl or heteroaryl group.

Preferred Ar groups include substituted or unsubstituted phenyl, biphenyl or fluorene groups. This is because the inclusion of these groups can have the effect of improving hole transport properties of the first repeat unit. Additionally, this can have the effect of modifying the semiconductor bandgap of the polymer, thus, modulating the wavelength of emission obtained from the polymer when used in an optical device. To this end, it is preferred that at least one of the Ar groups comprises at substituted or unsubstituted phenyl, biphenyl or fluorene group.

Particularly preferred first repeat units are shown by formulae (6) and (7) below:

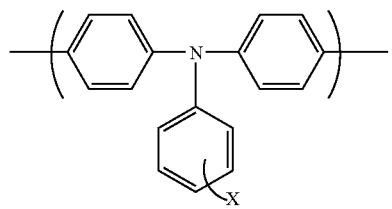

(6)

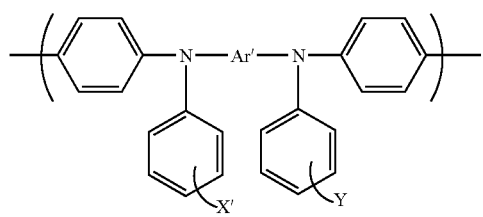

(7)

The repeat units shown by formulas (6) and (7) may be further substituted or may be unsubstituted. X' and Y may be the same or different. X, X' and Y each independently is hydrogen or a substituent group. In formula (7) Ar' is a substituted or unsubstituted aryl or heteroaryl group, or preferably is a phenyl, biphenyl or fluorene group.

X, X' and Y may be used to improve the solubility of the polymer. In this regard, any of X, X' and Y may be a solubilising group (i.e. any group which improves the solubility of the polymer as compared with the equivalent polymer not including that group). In addition, X, X' and Y may be used to further control the properties, particularly electronic properties, of the polymer, particularly by controlling the HOMO and LUMO levels and, thus, the semiconductor bandgap of the polymer. For these purposes, electron withdrawing or electron donating groups are suitable for use as X, X' or Y. Particularly preferred groups include alkyl, alkoxy, carboxyalkyl, halide, cyano, aryl and heteroaryl groups. Even more preferable X, X' and Y groups include $C_1$-$C_{10}$ alkyl and $C_1$-$C_{10}$ alkoxy groups.

In one embodiment of the first aspect of the present invention, the second repeat unit may have formula (1), (5), (6) or (7) as defined above in any general or preferred terms. In another embodiment of the first aspect of the present invention, the second repeat unit may be selected from the range of aryl or heteroaryl units disclosed in WO 00/55927.

A polymer, particularly a regular alternating copolymer or higher order polymer or a homopolymer, obtained by the method of the first aspect of the present invention also is provided.

According to a second aspect of the present invention, there is provided a linear regular alternating copolymer obtainable by the method according to one embodiment of the first aspect of the present invention.

In some copolymers and higher order polymers, it is possible to define different regions where each region may be defined to have a distinct HOMO level and a distinct LUMO level and thus a distinct semiconductor bandgap. Considering a region as a monomeric residue, it has been identified that it is possible to improve the distinctness of these regions where the monomeric residues are assembled in the form of a regular alternating copolymer or higher order polymer rather than a random copolymer or higher order polymer. Accordingly, a linear regular alternating copolymer according to the second aspect of the present invention will have more defined properties having regard to the individual properties of the first and second repeat units when used in a polymer as compared with a random copolymer. Linear regular alternating copolymers according to the second aspect of the present invention thus are highly desirable, especially for use in an optical device.

Hitherto unknown linear regular alternating copolymers that are obtainable by the method according to the first aspect of the present invention include those having two different triarylamine-containing repeat units, that is to say, linear regular alternating copolymers have first and second repeat units that are different from each other, both having a general formula as shown in or defined with reference to formulae (5), (6) or (7) above.

In this regard, a copolymer according to the second aspect of the present invention may be considered to be bi-functional when used in an optical device where the first repeat unit has one function and the second repeat unit has another. Typically, the two functions will be transporting positive charge carriers and accepting and combining positive and negative charge carriers to generate light.

Such copolymers include a copolymer having formula (8):

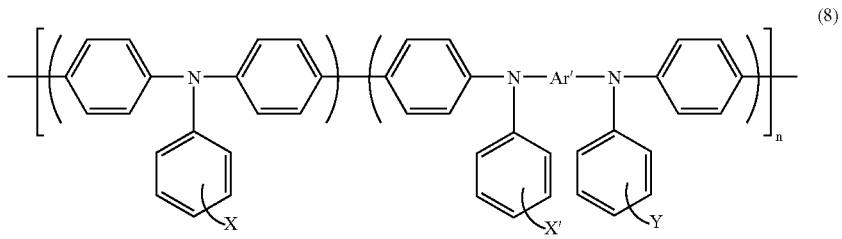

where n is at least 2 and Ar', X, X' and Y are as defined in any embodiment above in relation to the first aspect of the present invention.

In the polymer having formula (8), further substituents also may be used to improve the solubility of the polymer and/or to further control the HOMO and LUMO levels. Any substituents may be on the groups pendent to nitrogen. This avoids the substituents being in too close proximity to the polymerisation sites in the monomers used to prepare the polymer. However, substituents also may be provided in sites other than those on the groups pendent to nitrogen.

Typically, a polymer obtained by the method according to the first aspect of the present invention and copolymers according to the second aspect of the present invention will be soluble in non-polar solvents. Typical solvents include common organic solvents, toluene, xylene, THF and organic ink-jet ink formations.

Typically, a polymer obtained by the method according to the first aspect of the present invention and a copolymer according to the second aspect of the present invention will have an average molecular weight of at least $M_n$=about 10,000 daltons. Preferably, they will have an average molecular weight in the range 10,000 to $10^6$. Controlling the molecular weight of the polymer is one way of controlling the rheological properties of the polymer.

It is envisaged that a polymer obtained by the method according to the first aspect of the present invention and a copolymer according to the second aspect of the present invention will be useful for charge transport, particularly for transporting positive charge carriers, and/or emitting light in a optical device.

A polymer of particular interest having general formula (8) is shown in general formula (9):

According to a third aspect of the present invention, there is provided a monomer suitable for the preparation of a linear polymer having formula (11) or (12):

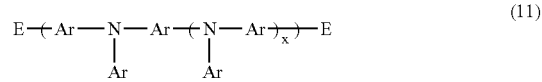

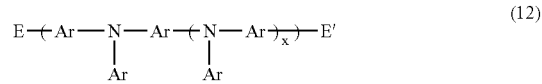

where E and E' are as defined above in relation to formulas (2) and (3) respectively and x and Ar are as defined above in any general or preferred embodiment according to the first aspect of the present invention.

Monomers according to the third aspect of the present invention are suitable for use in the method according to the first aspect of the present invention. Generally, the monomers according to the third aspect of the present invention have opened up the way for the preparation of homopolyamines and regular alternating amine-containing copolymers or higher order polymers by the 'Suzuki reaction'. This allows good control of the hole injection properties in the resultant polymer.

A fourth aspect of the present invention provides the use of a polymer obtained by the method according to the first aspect of the present invention or a copolymer according to the second aspect of the present invention as a component in an optical device. Preferably, the polymer is used for transporting positive charge carriers and/or for accepting and

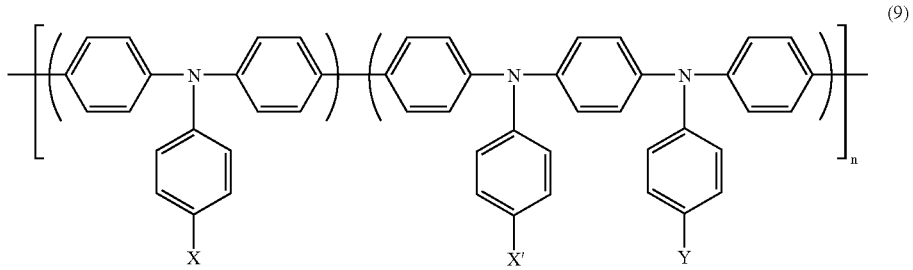

which may be further substituted or unsubstituted and where n is at least 2 and X, X', and Y independently are selected from the group consisting of $C_1$-$C_{10}$ alkyl or $C_1$-$C_{10}$ alkoxy groups.

combining positive and negative charge carriers to generate light in an optical devices Due to the nature of either the first or second repeat unit defined above, it is envisaged that when the present polymers are used for combining positive and negative charges carriers to generate light in an optical device, although not so limited, they predominantly will be useful as sources of "blue" light. For the purposes of the present invention, "blue" light may be defined to include light having a wavelength in the range from 360 nm to 490 nm. Nevertheless, polymers having a first repeat unit as defined above also may be useful as sources of light having a wavelength outside this range.

Specifically, the optical device may comprise an electroluminescent device.

Other uses for a polymer obtained by the method according to the first aspect of the present invention or a copolymer according to the second aspect of the present invention include use as a hole transport material or use in a photovoltaic device.

Where the present polymer is soluble, this confers the advantage of allowing the polymer to be processed in solution.

A film or coating comprising a polymer obtained by the method according to the first aspect of the present invention or a copolymer according to the second aspect of the present invention also is provided. Further, a composition comprising a mixture or blend comprising one or more polymers obtained by the method according to the first aspect of the present invention or one or more copolymers according to the second aspect of the present invention is provided. Preferably, the mixture or blend will comprise one or two further different polymers.

The fifth aspect of the present invention provides an optical device or a component therefor, which comprises a substrate and a polymer obtained by the method according to the first aspect of the present invention or a copolymer according to the second aspect of the present invention supported on the substrate. Preferably the optical device comprises an electroluminescent device.

Hole transport materials or components and electron transport materials or components generally may be referred to as charge transport materials or components.

A preferred electroluminescent device according to the present invention comprises a first charge carrier injecting layer for injecting positive charge carriers, a second charge injecting layer for injecting negative charge carriers, a light-emissive layer for accepting and combining positive and negative charge carriers from the first and second charge injecting layers to generate light and optionally one or more charge transport layers located either between the first charge injecting layer and the light-emissive layer or between the second charge injecting layer and the light-emissive layer. The light-emissive layer will comprise a light-emissive component and optionally one or more positive and/or negative charge transport components. The light-emissive layer will comprise at least one polymer obtained by the method according to the first aspect of the present invention or at least one copolymer according to the second aspect of the present invention. A single polymer obtained by the method according to the first aspect of the present invention or a single copolymer according to the second aspect of the present invention may be provided as the light-emissive component and/or as a positive charge transport component.

It will be appreciated that the light-emissive layer may be formed from a blend of materials including one or more polymers obtained by the method according to the first aspect of the present invention or one or more copolymers according to the second aspect of the present invention, and optionally further different polymers. As mentioned above, the one or more polymers obtained by the method according to the first aspect of the present invention or the one or more polymers according to the second aspect of the present invention may be included in order to improve the efficiency of charge transport from the electrodes to the light-emissive component, particularly to improve the efficiency of hole transport. Alternatively or additionally, a polymer according to the present invention (which may be the same polymer included to improve the efficiency of charge transport) may be included as the light-emissive component. Where a polymer according to the present invention is included as at least the light-emissive component, the blend would comprise greater than 0.1% by weight of the polymer according to the second aspect of the present invention, preferably from about 0.2 to 100, more preferably 0.5 to 50% by weight, with the remainder of the blend comprising further charge transport polymers.

Alternatively, as indicated above, a polymer obtained by the method according to the first aspect of the present invention or a copolymer according to the second aspect of the present invention may be provided in an electroluminescent device as a discrete layer situated between either the first or second charge injecting layers and a discrete layer comprising the light-emissive component. Also, it may be provided as a discrete layer which is the light-emissive component. These discrete layers optionally may be in contact with one or more (additional) hole and/or electron transporting layers.

A sixth aspect of the present invention provides the use of a monomer according to the third aspect of the present invention for the preparation of a polymer. Preferably, the use is for the preparation of a polymer that is provided as a component of an optical device. More preferably, the use is for the preparation of a polymer wherein the polymer is provided as a light-emissive component and/or a positive charge transport component of an optical device.

The present invention now will be described in more detail with reference to the accompanying drawings in which:

FIG. 1 is a schematic diagram of an optical device.

EXAMPLE 1

Preparation of PFB Homopolymer

A solution of the pinacol diester of PFB boronic acid (5.00 g, 7 mmol), dibromo-PFB (4.79 g, 7 mmol), and dichloro bis(triphenyl phosphine) palladium (25 mg) in toluene (100 mL) was de-gassed with nitrogen. After 1 hour, tetraethyl ammonium hydroxide (24 mL) was, added to the reaction mixture and the suspension heated to ~120° C. (external temp.). After 18 hours, the reaction was end-capped with bromobenzene and the glycol ester of benzeneboronic acid. The reaction mixture was poured into methanol to precipitate the polymer which was then filtered and dried, affording 6.3 g of polymer (Mn 23,000).

EXAMPLE 2

Preparation of TFB-PFB Copolymer

The process of example 1 was followed except that a boronic acid ester of TFB was used in place of PFB as outlined in the scheme below.

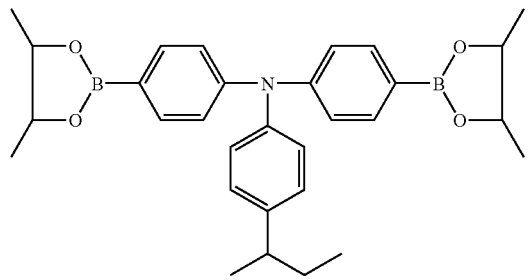

"TFP ester"

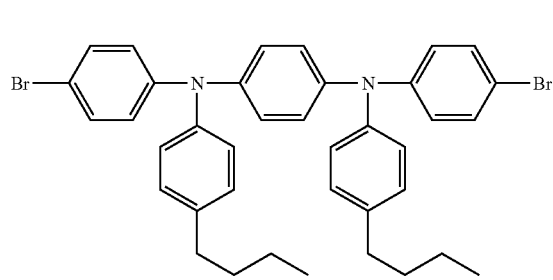

"Dibromo-PFB"

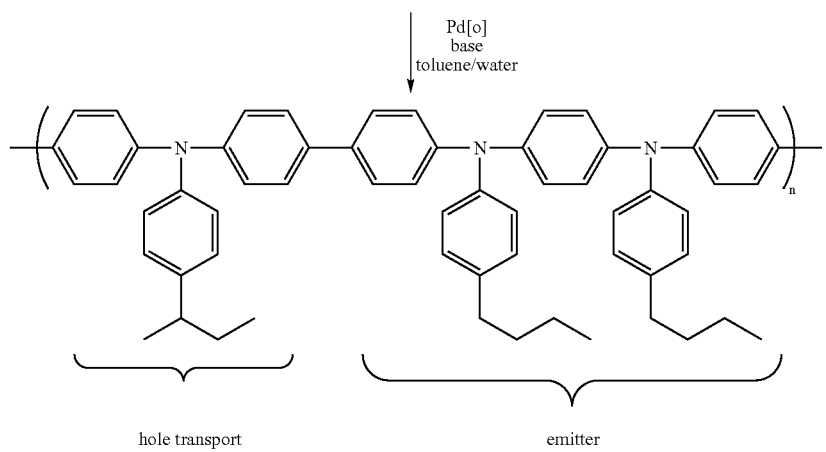

hole transport     emitter

EXAMPLE 3

Optical Device

A suitable device structure is shown in FIG. 1. The anode 2 has a layer of transparent indium-tin oxide supported on a glass or plastic substrate 1. The anode 2 layer has a thickness between 1000 to 2000 Å, usually about 1500 Å. The cathode 5 is a Ca layer having an approximate thickness of 1500 Å. Between the electrodes is a light-emissive layer 4 having a thickness up to about 1000 Å. The light-emissive layer 4 comprises between 0.5 to 100% by weight of a polymer according to the present invention as a combined light-emissive component and hole transport component with the remainder of the light-emissive layer consisting of hole and/or electron transport material. The polymer according to the present invention, for example may be a TFB-PFB regular alternating copolymer.

"TFB"

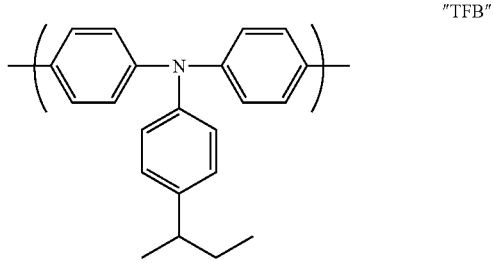

-continued

"PFB"

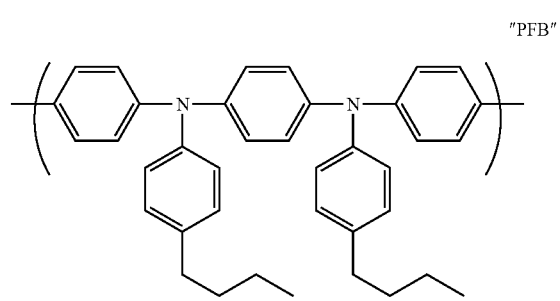

Advantageously, the device includes a hole transport material layer 3 of PEDOT having a thickness of about 1000 Å. Layer 6 is an encapsulant layer of suitable thickness.

The invention claimed is:

1. A method for making a polymer containing a first repeat unit and a second repeat unit that is the same or different from the first repeat unit, wherein the second repeat unit includes an amine moiety comprising at least one substituted or unsubstituted aryl or heteroaryl group, and the first repeat unit has formula (1):

$$\text{—[Ar—N(R)—Ar—(N(R')—Ar)}_x\text{]—} \tag{1}$$

which may be substituted or unsubstituted;
where x is 0 or 1;
each Ar is the same or different and independently is a substituted or unsubstituted aryl or heteroaryl group; and, R and R' are the same or different and independently are hydrogen or a substituent group, comprising the step of polymerizing in a reaction mixture:

(a) a plurality of first monomers each (i) containing the first repeat unit and (ii) having only two reactive boron derivative groups and a plurality of second monomers each (i) containing the second repeat unit and (ii) having at least two reactive halide functional groups; or (b) a plurality of first monomers each (i) containing the first repeat unit and (ii) having one reactive halide functional group and one reactive boron derivative group and a plurality of second monomers each (i) containing the second repeat unit and (ii) having one reactive halide functional group and one reactive boron derivative group;

wherein the reaction mixture comprises a base and a catalytic amount of a catalyst suitable for catalyzing the polymerization of the monomers.

2. A method according to claim 1(b), wherein the first repeat unit is the same as the second repeat unit; and each first monomer is the same as the second monomer and has a formula (10):

E—first repeat unit—E'      (10)

where E is a reactive boron derivative group that is selected from the group consisting of a boronic acid group, a boronic ester group, and a borane group, and E' is a reactive halide functional group.

3. A method according to claim 1(a) wherein each first monomer has a formula (2):

E—first repeat unit—E      (2)

where each E is a reactive boron derivative group that is selected from the group consisting of a boronic acid group, a boronic ester group and a borane group.

4. A method according to claim 3, where each second monomer has a formula (3):

E'—second repeat unit—E'      (3)

where each E' is a reactive halide functional group such that the polymer comprises a polymer having formula (4):

      (4)

where n is at least 2.

5. A method according to claim 3, wherein the first repeat unit is the same as the second repeat unit.

6. A method according to claim 3, wherein the first repeat unit is different from the second repeat unit.

7. A method according to claim 1, wherein the first repeat unit has formula (5):

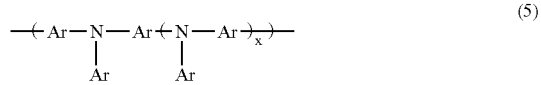      (5)

which may be substituted or unsubstituted, where x is 0 or 1 and each Ar is the same or different.

8. A method according to claim 7, wherein at least one of the Ar groups comprises a substituted or unsubstituted phenyl, biphenyl, or fluorene group.

9. A method according to claim 8, wherein the first repeat unit has formula (6):

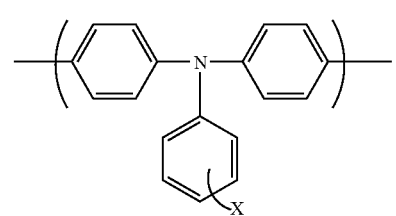      (6)

which may be further substituted or unsubstituted and where X is hydrogen or a substituent group.

10. A method according to claim 8, wherein the first repeat unit has formula (7):

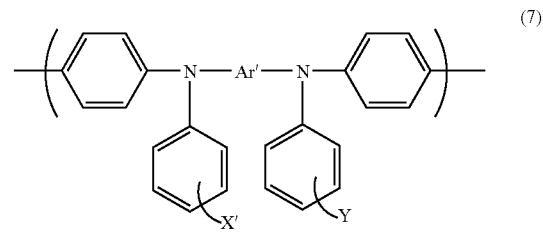      (7)

which may be further substituted or unsubstituted and where X' and Y independently are hydrogen or a substituent group and Ar' is a phenyl, biphenyl or fluorene group.

11. A method according to claim 9, wherein X is selected from the group consisting of alkyl, alkoxy, carboxyalkyl, halide, cyano, aryl and heteroaryl groups.

12. A method according to claim 1, where the second repeat unit has a formula (5):

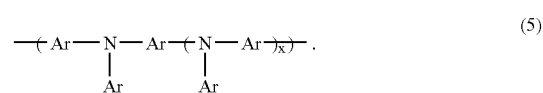      (5)

13. A method according to claim 4, wherein the first repeat unit is the same as the second repeat unit.

14. A method according to claim 4, wherein the first repeat unit is different from the second repeat unit.

15. A method according to claim 10, wherein X' and Y are the same or different and X' and Y are independently selected from the group consisting of alkyl, alkoxy, carboxyalkyl, halide, cyano, aryl and heteroaryl groups.

16. A method according to claim 12, wherein at least one of the Ar groups comprises a substituted or unsubstituted phenyl, biphenyl, or fluorene group.

17. A method according to claim 16, wherein the first repeat unit has formula (6):

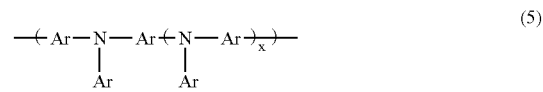      (5)

which may be further substituted or unsubstituted and where X is hydrogen or a substituent group.

18. A method according to claim 16, wherein the first repeat unit has formula (7):

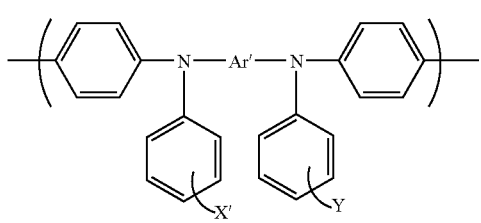
(7)

which may be further substituted or unsubstituted and where X' and Y independently are hydrogen or a substituent group and Ar' is a phenyl, biphenyl or fluorene group.

19. A method according to claim 17, wherein X is selected from the group consisting of alkyl, alkoxy, carboxyalkyl, halide, cyano, aryl and heteroaryl groups.

20. A method according to claim 18, wherein X' and Y are the same or different and X' and Y are independently selected from the group consisting of alkyl, alkoxy, carboxyalkyl, halide, cyano, aryl and heteroaryl groups.

21. A method for making a polymer containing a first repeat unit and a second repeat unit that is different from the first repeat unit, wherein the second repeat unit includes an amine moiety comprising at least one substituted or unsubstituted aryl or heteroaryl group, and the first repeat unit has formula (1):

(1)

which may be substituted or unsubstituted;
where x is 0 or 1;
each Ar is the same or different and independently is a substituted or unsubstituted aryl or heteroaryl group; and,
R and R' are the same or different and independently are hydrogen or a substituent group, comprising the step of polymerizing in a reaction mixture:
(a) a plurality of first monomers each (i) containing the first repeat unit and (ii) having only two reactive boron derivative groups and a plurality of second monomers each (i) containing the second repeat unit and (ii) having at least two reactive halide functional groups; or
(b) a plurality of first monomers each (i) containing the first repeat unit and (ii) having one reactive halide functional group and one reactive boron derivative group and a plurality of second monomers each (i) containing the second repeat unit and (ii) having one reactive halide functional group and one reactive boron derivative group;
wherein the reaction mixture comprises a base and a catalytic amount of a catalyst suitable for catalyzing the polymerization of the monomers.

22. A method according to claim 21(a) wherein each first monomer has a formula (2):

(2)

where each E is a reactive boron derivative group that is selected from the group consisting of a boronic acid group, a boronic ester group and a borane group.

23. A method according to claim 22, where each second monomer has a formula (3):

(3)

where each E' is a reactive halide functional group such that the polymer comprises a polymer having formula (4):

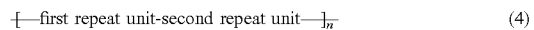
(4)

where n is at least 2.

24. A method according to claim 21, wherein the first repeat unit has formula (5):

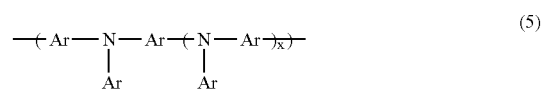
(5)

which may be substituted or unsubstituted, where x is 0 or 1 and each Ar is the same or different.

25. A method according to claim 24, wherein at least one of the Ar groups comprises a substituted or unsubstituted phenyl, biphenyl, or fluorene group.

26. A method according to claim 25, wherein the first repeat unit has formula (6):

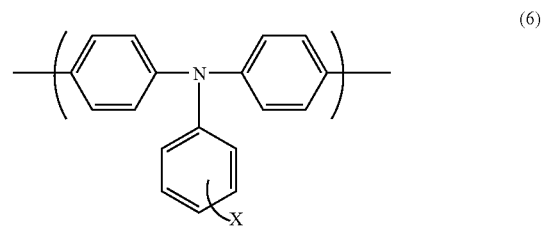
(6)

which may be further substituted or unsubstituted and where X is hydrogen or a substituent group.

27. A method according to claim 25, wherein the first repeat unit has formula (7):

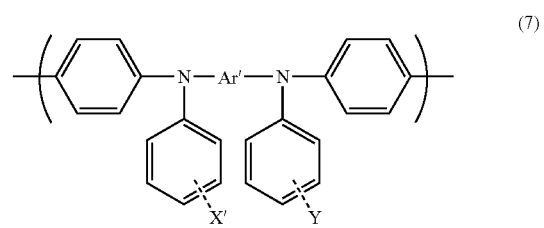
(7)

which may be further substituted or unsubstituted and where X' and Y independently are hydrogen or a substituent group and Ar' is a phenyl, biphenyl or fluorene group.

28. A method according to claim 26, wherein X is selected from the group consisting of alkyl, alkoxy, carboxyalkyl, halide, cyano, aryl and heteroaryl groups.

29. A method according to claim 21, where the second repeat unit has a formula (5):

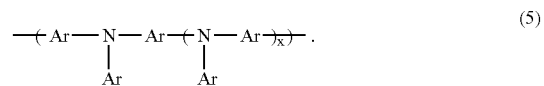
(5)

30. A method according to claim 27, wherein X' and Y are the same or different and X' and Y are independently selected from the group consisting of alkyl, alkoxy, carboxyalkyl, halide, cyano, aryl and heteroaryl groups.

31. A method according to claim 29, wherein at least one of the Ar groups comprises a substituted or unsubstituted phenyl, biphenyl, or fluorene group.

32. A method according to claim 31, wherein the first repeat unit has formula (6):

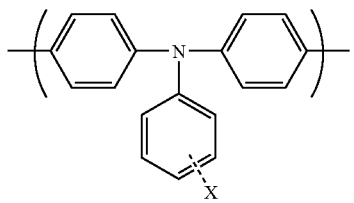

(6)

which may be further substituted or unsubstituted and where X is hydrogen or a substituent group.

33. A method according to claim 31, wherein the first repeat unit has formula (7):

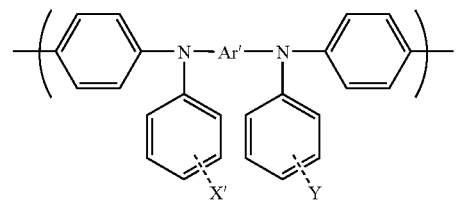

(7)

which may be further substituted or unsubstituted and where X' and Y independently are hydrogen or a substituent group and Ar' is a phenyl, biphenyl or fluorene group.

34. A method according to claim 32, wherein X is selected from the group consisting of alkyl, alkoxy, carboxyalkyl, halide, cyano, aryl and heteroaryl groups.

35. A method according to claim 33, wherein X' and Y are the same or different and X' and Y are independently selected from the group consisting of alkyl, alkoxy, carboxyalkyl, halide, cyano, aryl and heteroaryl groups.

* * * * *

UNITED STATES PATENT AND TRADEMARK OFFICE
CERTIFICATE OF CORRECTION

PATENT NO.       : 7,351,788 B2
APPLICATION NO.  : 10/481439
DATED            : April 1, 2008
INVENTOR(S)      : Richard O'Dell et al.

It is certified that error appears in the above-identified patent and that said Letters Patent is hereby corrected as shown below:

In the Specification:
At Column 1, line 28, please delete "known," and insert -- known --
At Column 4, line 24, please delete "P" and insert -- F --
At Column 10, line 53, please delete "was, added" and insert -- was added --
At Column 11, first structure, please delete "TFP ester" and insert -- TFB ester --

In the Claims:
In Claim 17, column 14, line 60, please delete

" 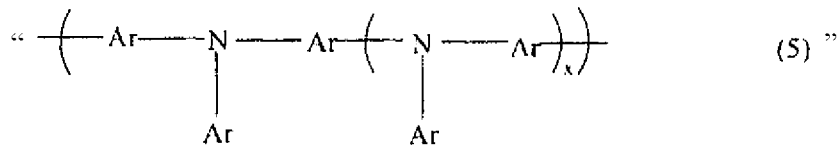   (5) "

and insert

-- 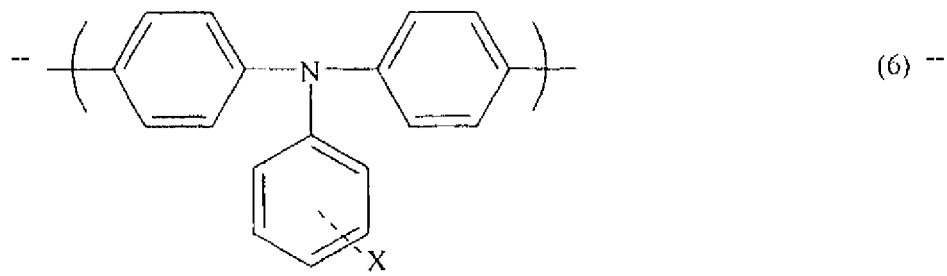   (6) --

Signed and Sealed this

Ninth Day of February, 2010

David J. Kappos
*Director of the United States Patent and Trademark Office*